US012787859B2

(12) United States Patent
Koller et al.

(10) Patent No.: US 12,787,859 B2
(45) Date of Patent: Nov. 3, 2026

(54) THREE-DIMENSIONAL STACK COOLING WINGS

(71) Applicant: Intel Corporation, Santa Clara, CA (US)

(72) Inventors: Sonja Koller, Lappersdorf (DE); Vishnu Prasad, Munich (DE); Bernd Waidhas, Pettendorf (DE); Eduardo De Mesa, Munich (DE); Lizabeth Keser, San Diego, CA (US); Thomas Wagner, Regelsbach (DE); Mohan Prashanth Javare Gowda, Ottobrunn (DE); Abdallah Bacha, Munich (DE); Jan Proschwitz, Riesa (DE)

(73) Assignee: INTEL FOUNDRY IP LLC, Santa Clara, CA (US)

( * ) Notice: Subject to any disclaimer, the term of this patent is extended or adjusted under 35 U.S.C. 154(b) by 322 days.

(21) Appl. No.: 17/709,481

(22) Filed: Mar. 31, 2022

(65) Prior Publication Data

US 2023/0317681 A1 Oct. 5, 2023

(51) Int. Cl.

| | |
|---|---|
| ***H01L 25/065*** | (2023.01) |
| ***H10W 40/22*** | (2026.01) |
| ***H10W 40/73*** | (2026.01) |
| ***H10W 90/00*** | (2026.01) |
| *H10W 40/25* | (2026.01) |
| *H10W 72/00* | (2026.01) |
| *H10W 72/20* | (2026.01) |
| *H10W 90/20* | (2026.01) |

(52) U.S. Cl.

CPC ........... *H10W 90/00* (2026.01); *H10W 40/22* (2026.01); *H10W 40/73* (2026.01); *H10W 40/25* (2026.01); *H10W 40/258* (2026.01); *H10W 72/248* (2026.01); *H10W 72/856* (2026.01); *H10W 90/288* (2026.01); *H10W 90/722* (2026.01); *H10W 90/724* (2026.01); *H10W 90/734* (2026.01); *H10W 90/736* (2026.01)

(58) Field of Classification Search

CPC .. H01L 25/0657; H01L 23/367; H01L 23/427

See application file for complete search history.

(56) References Cited

U.S. PATENT DOCUMENTS

| | | | | |
|---|---|---|---|---|
| 2006/0044773 A1* | 3/2006 | Akram | H10W 90/00 257/E25.013 |
| 2020/0357721 A1* | 11/2020 | Sankman | H10W 40/22 |
| 2021/0193547 A1* | 6/2021 | Wan | H10W 40/10 |
| 2023/0144206 A1* | 5/2023 | Dogiamis | H01Q 1/2283 257/774 |
| 2023/0187407 A1* | 6/2023 | Molnar | H10W 20/20 257/777 |
| 2023/0317551 A1* | 10/2023 | Prasad | H10W 40/228 257/675 |

* cited by examiner

*Primary Examiner* — Thao P Le

(74) *Attorney, Agent, or Firm* — Alliance IP, LLC

(57) ABSTRACT

Disclosed herein are microelectronic packages having thermally conductive layers and methods for manufacturing the same. The microelectronics packages may include a substrate and a plurality of dies connected to the substrate and/or each other to form a die stack. The dies may have a perimeter. A thermally conductive layer may be located in between the respective dies. The thermally conductive layers may extend past at least a portion of the perimeters, thereby providing enhanced cooling of the die stack.

20 Claims, 9 Drawing Sheets

THREE-DIMENSIONAL STACK COOLING WINGS

FIELD OF THE DISCLOSURE

The present subject matter relates to microelectronics packages. More specifically, the present disclosure relates to thermal pillar towers used in microelectronics package applications to achieve high thermal power dissipation.

BACKGROUND

Complex advanced two-dimensional and three-dimensional stacked dies in a microelectronics package are facing performance limitations due to high thermal resistive paths. During operations, the heat generated by the microelectronics package flows through all the dies before it reaches a heat sink, generating a temperature drop across the stack. Disclosed herein are solutions for extracting the generated heat to improve the thermal power dissipation.

BRIEF DESCRIPTION OF THE FIGURES

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Three-dimensional dies or package stacking may lead to high power densities and high cross-heating between the stacked devices. Heat flowing through the stack to a top or bottom side cooling solution may generate temperature increases on every single device, which may limit the performance. The thermally conductive layers disclosed herein, sometimes referred to as thermal cooling wings or thermally conductive sheets, may offer enhanced cooling by taking heat outside the stack at each device interface.

The thermally conductive sheets, which may extend beyond the stack may be attached between all, or a subset of, devices in a stack. If the sheets are rigid, such as if they are made of copper, they may form fins at the stack side for improved air cooling. Flexible sheets, such as if they are made of graphite, may bend down the stack side and form or be connected to a heat path outside the stack to a printed circuit board (PCB).

As disclosed herein, microelectronics packages can include a substrate, a plurality of dies, and one or more thermally conductive layers. The various dies each have sides that define a perimeter. The various thermally conductive layers can extend past the perimeter of the dies in which they are located in between. The portions of the thermally conductive layers that extend, or otherwise overhang from the dies, may allow heat generated from the various dies to be extracted in a more efficient manner. As disclosed herein, the term die may include, but is not limited to, an die having bumps, balls, or other electrical interconnects, and/or a package of stacked dies.

As disclosed herein, the thermally conductive layer may extend past opposite ends of a perimeter of one or more dies. The thermally conductive layer may extend past the entire perimeter of one or more dies. A portion of the thermally conductive layer may be connected to the substrate. Electrical interconnects, such as bumps, balls, copper pillars, etc., extending from the various dies may pass through holes defined by the thermally conductive layers.

Portions of the thermally conductive layer extending past edges of dies may be flexible. Portions of the thermally conductive layer extending past edges of dies may be rigid. For example, the thermally conductive layer may be thin layers of a metallic material. The thermally conductive layer may be a graphene or carbon based material. A heat sink and/or a heat pipe may be connected to the thermally conductive layers and may connect the thermally conductive layer to the substrate and/or one or more of the thermally conductive layers, which may then be connected to the substrate.

The above discussion is intended to provide an overview of subject matter of the present patent application. It is not intended to provide an exclusive or exhaustive explanation. The description below is included to provide further information.

Figure 1A:
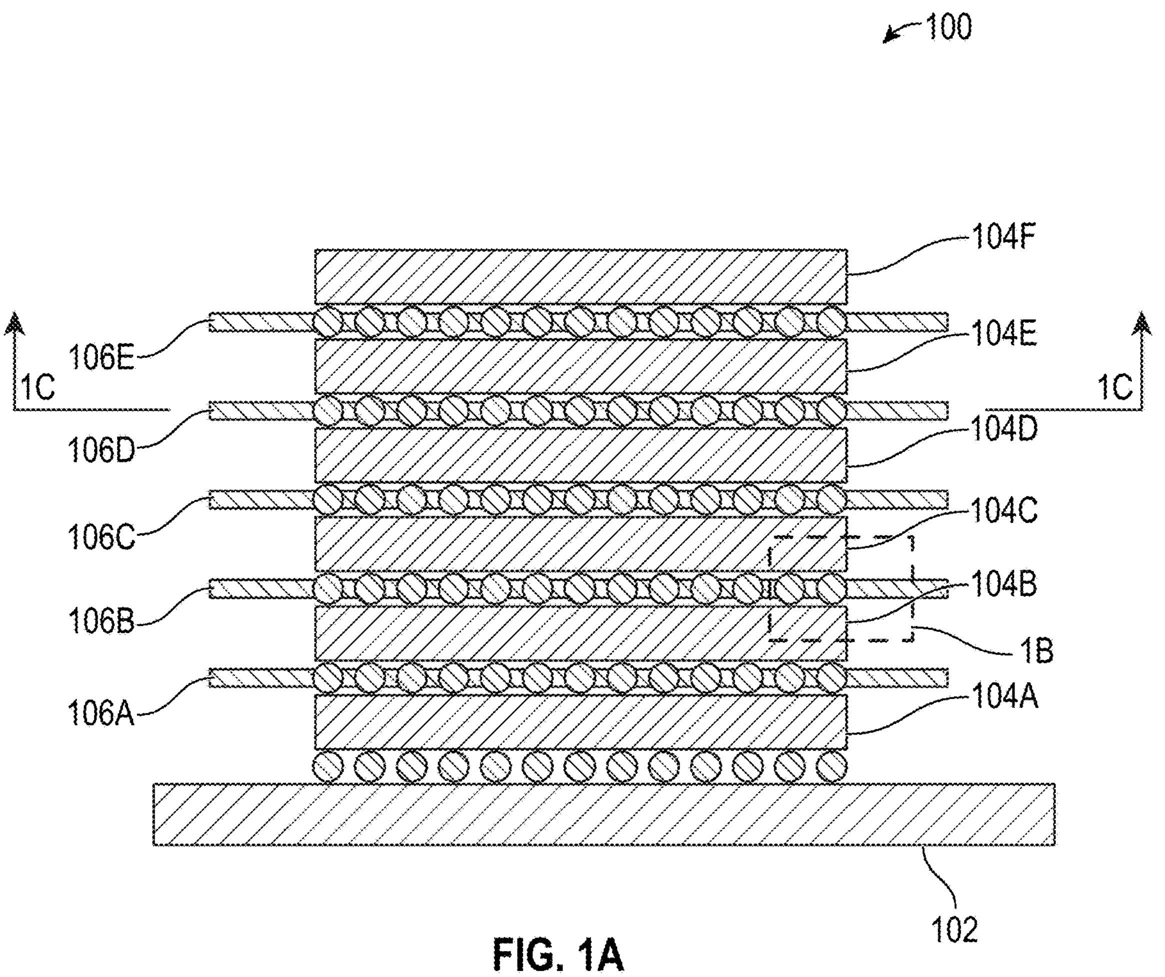
FIG. 1A shows a microelectronics package in accordance with at least one example of this disclosure.
Figure 1B:
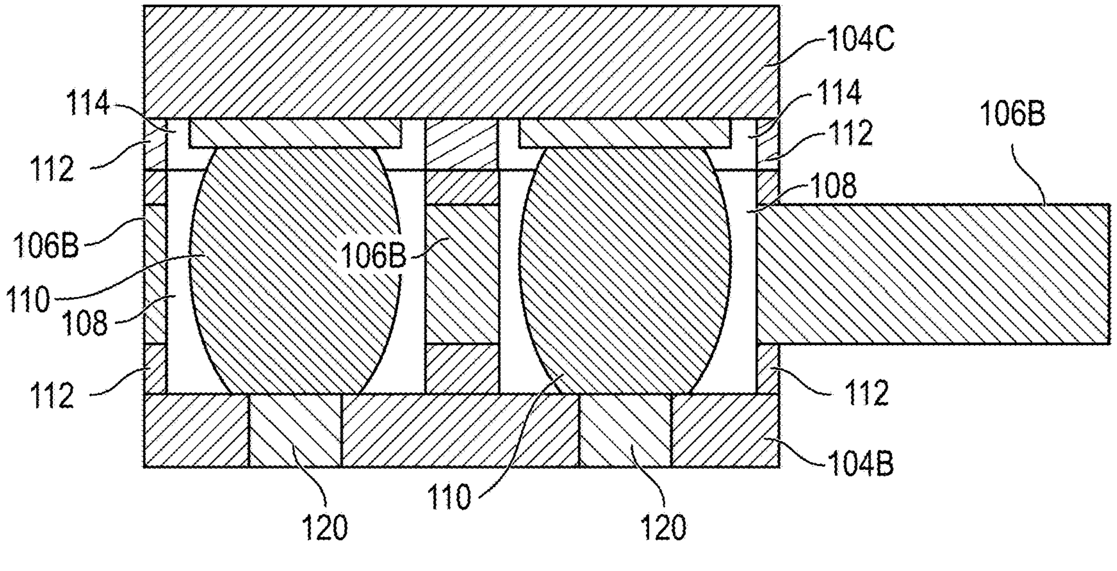
FIG. 1B shows a detail of a microelectronics package in accordance with at least one example of this disclosure.

Turning now to the figures, FIG. 1A shows a microelectronics package 100 in accordance with at least one example of this disclosure. Microelectronics package 100 may include a substrate 102 having dies 104 (labeled individually as dies 104A, 104B, 104C, 104D, 104E, and 104F) stacked forming a die stack attached to substrate 102. Thermally conductive layers 106 (labeled individually as thermally conductive layers 106A, 106B, 106C, 106D, and 106E) may be located in between adjacent dies 104. As shown in FIG. 1B, thermally conductive layers 106 may define one or more through holes 108. Through holes 108 may allow one or more bumps 110 to pass through thermally conductive layers 106 to electrically couple adjacent dies 104 as shown and described with respect to at least FIG. 1B.

As shown in FIGS. 1A and 1B, thermally conductive layers 106, sometimes referred to as thermally conductive sheets, may extend beyond the perimeter of respective dies in which they are located in between. For example, thermally conduct layers 106 may be a rigid material, such as copper, and may form fins at sides of the stack side for improved air cooling.

Figure 1C:
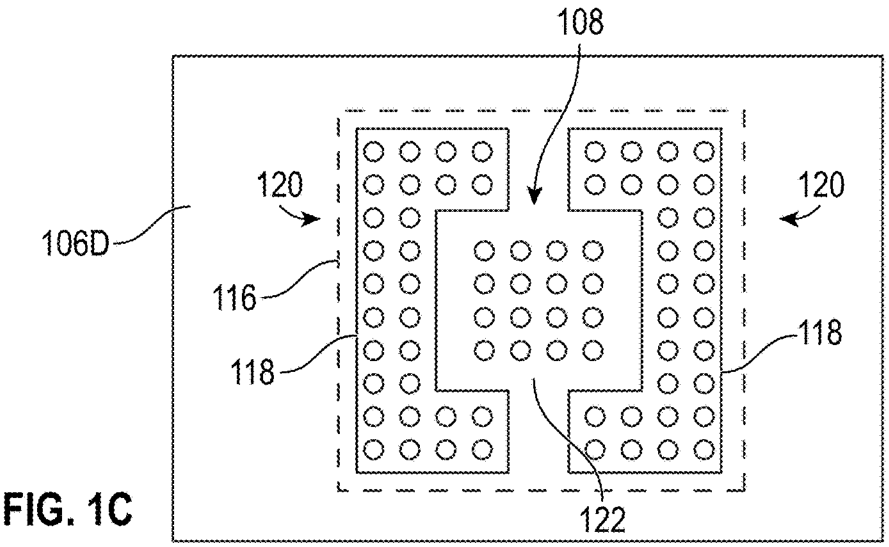
FIGS. 1C, 1D, and 1E each shows a cross-section of a microelectronics package in accordance with at least one example of this disclosure.

During fabrication of microelectronics package 100, adhesive layers 112 may be used to attach dies 104 to thermally conductive layers 106. In addition, solder mask 114, or a frontside metal coatings, such as sputter, may also come with a die. Adhesive layers 112 may be either adhesive, or thermal interface material (e.g., grease, thermal glue, solder in case of metal-to-metal connect, etc.). One or more adhesive layers 112 could come with a thermal shield, such as thermally conductive layers 106, and/or be printed separately. Also, the backside of die 104B could come with a metal coating. For example, FIG. 1C shows a cross-section of microelectronics package 100 in accordance with at least one example of this disclosure. As shown in FIG. 1C, portions of thermally conductive layer 106D can extend past a portion or the enter perimeter 116 of microelectronics package 100. As shown in FIG. 1C, a plurality of individual through holes 108 can be formed in thermally conductive layer 106D in which individual vias may pass through. One or more larger openings 118 may be formed to allow a plurality of vias 120 to pass through a single opening.

As shown in FIG. 1C, a portion 122 of thermally conductive layer 106D may reach interior portions of a die stack. As a result, thermally conductive layer 106D may allow heat generated at central portions of a die to be conducted away from the die via thermally conductive layer 106D instead of the heat being trapped within the die or forced to conduct through large portions of the die to reach a cooling solution and/or otherwise be extracted from microelectronics package 100.

Figure 1D:
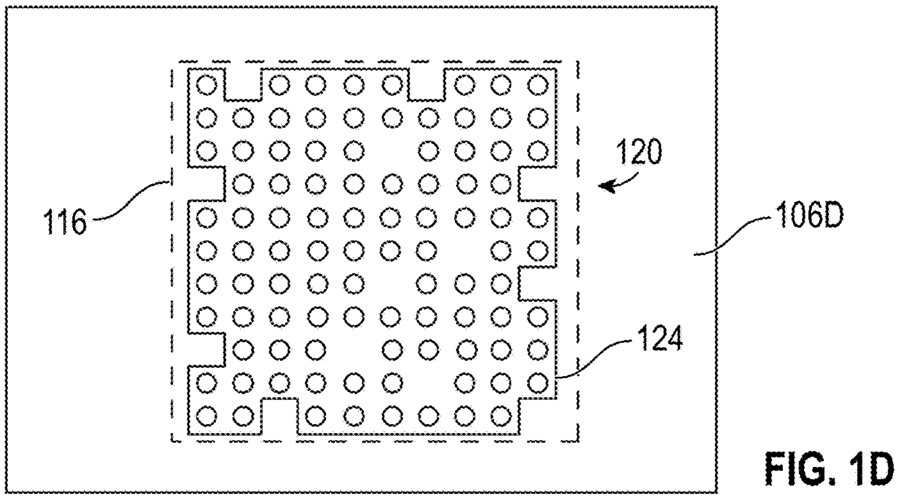
Figure 1E:
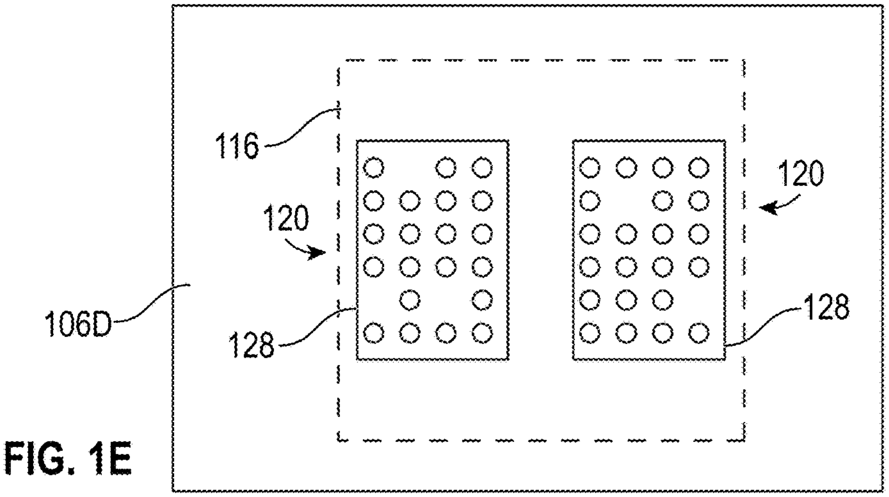

FIGS. 1D and 1E each shows a cross-section of a microelectronics package in accordance with at least one example of this disclosure. FIGS. 1D and 1C each show that different opening patterns are contemplated and that openings, such as opening 124, need not be symmetric as shown in FIG. 1C, but may be symmetric as shown by openings 128 in FIG. 1E. Nor do the location of vias 120 need to be symmetric as shown in FIG. 1E. The example patterns shown in FIGS. 1C, 1D, and 1E, may represent different thermally conductive layers 106 withing microelectronics package 100.

Figure 2:
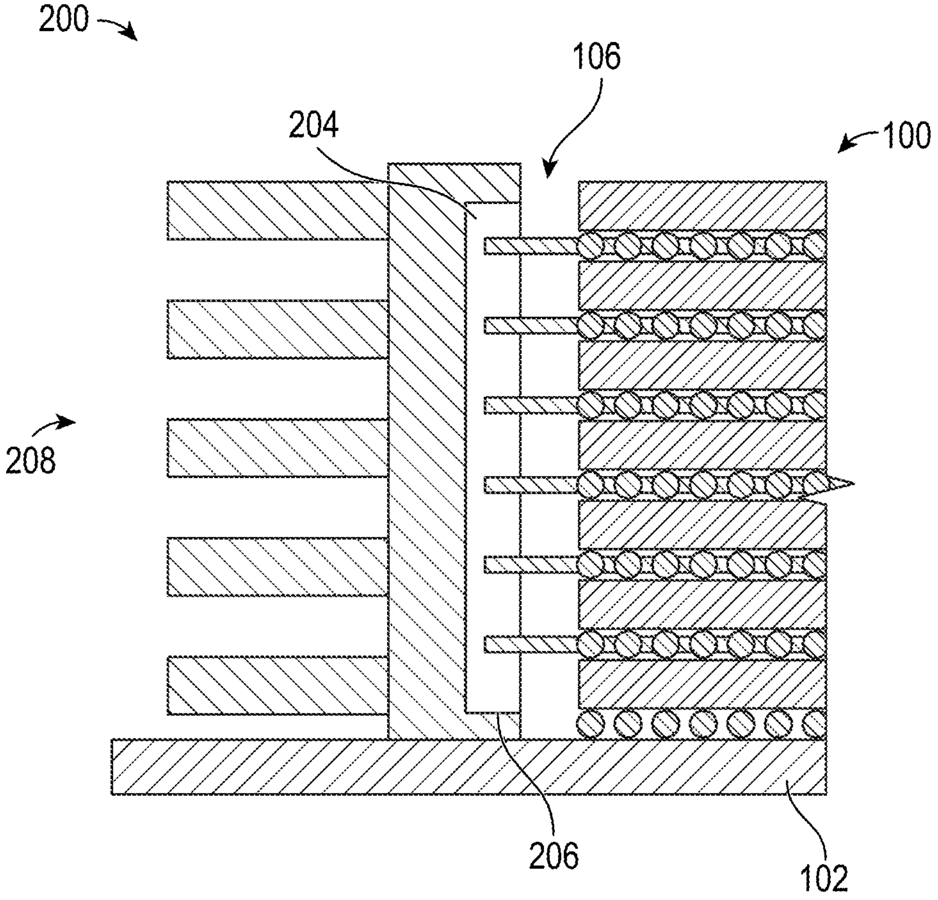
FIG. 2 shows a cooling solution for a microelectronics package in accordance with at least one example of this disclosure.

FIG. 2 shows a heat sink 200 attached to thermally conductive layers 106 in accordance with at least one example of this disclosure. As shown in FIG. 2, heat sink 200 may be spaced apart from the die stack to allow air to flow over exposed portions of thermally conductive layers 106 to allow for convective heat transfer to extract a portion of the heat conducted through thermally conductive layers 106. The location of heat sink 200 may be based on technical requirements to enable mounting of heat sink 200. Stated another way, depending on a particular application and design constraints, the location of heat sink 200 may vary without departing from the scope of this disclosure.

A thermal interface material 204 may be located in a cavity 206 defined by heat sink 200. Thermal interface material 204 may increase the efficiency of heat transfer from the tips of thermally conductive layers 106 by reducing contact resistance at the interface between thermally conductive layers 106 and heat sink 200. Heat sink 200 may include fins 208 to provide increased surface area for more effective natural or forced convection. While not shown, fins 208 and/or heat sink 200 in general may be part of a water cooling solution without departing from this disclosure.

Figure 3A:
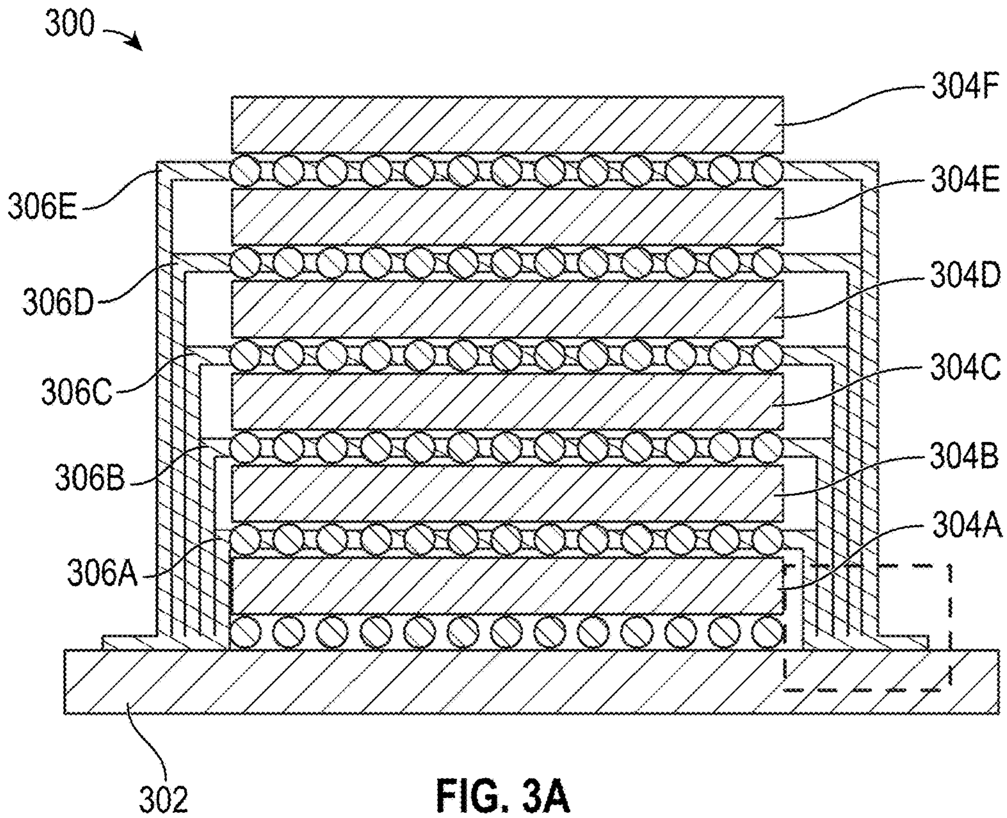
FIG. 3A shows a microelectronics package in accordance with at least one example of this disclosure.
Figure 3B:
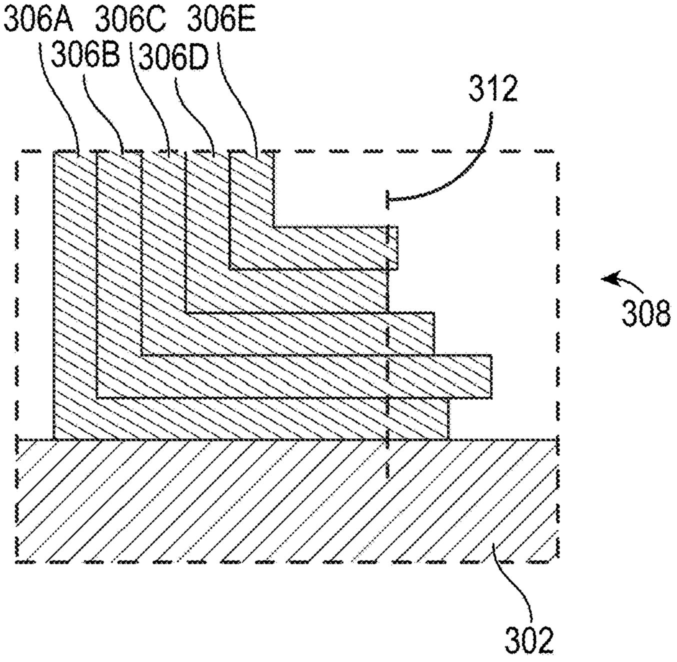
FIG. 3B shows a detail of a microelectronics package in accordance with at least one example of this disclosure.

FIG. 3A shows a microelectronics package 300 in accordance with at least one example of this disclosure. FIG. 3B shows a detail of microelectronics package 300 in accordance with at least one example of this disclosure. Microelectronics package 300 may include a substrate 302 having dies 304 (labeled individually as dies 304A, 304B, 304C, 304D, 304E, and 304F) stacked forming a die stack attached to substrate 302. Thermally conductive layers 306 (labeled individually as thermally conductive layers 306A, 306B, 306C, 306D, and 306E) may be located in between adjacent dies 304. Thermally conductive layers 306 may define one or more through holes as disclosed herein with respect to at least FIG. 1B. The through holes may allow one or more bumps to pass through thermally conductive layers 306 to electrically couple adjacent dies 304. Patterns for openings may be formed in thermally conductive layers 306 as disclosed herein with respect to at least FIGS. 1C, 1D, and 1E.

Figure 3C:
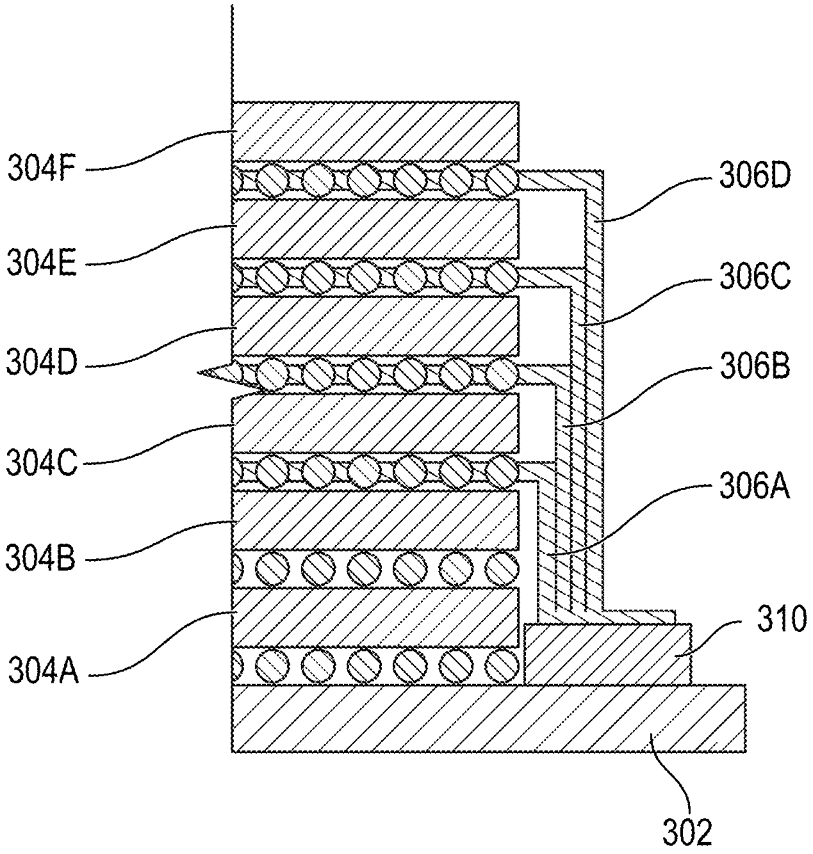
FIG. 3C shows a microelectronics package with a heat pipe in accordance with at least one example of this disclosure.

As shown in FIG. 3A, thermally conductive layers 306, sometimes referred to as thermally conductive sheets, may extend beyond the perimeter of respective dies in which they are located in between. Thermally conductive layers 306 may also be flexible and bent as shown in FIGS. 3A, 3B and 3C. For example, thermally conductive layers 306 may be made of graphene, thin flexible metallic materials, etc. that may allow thermally conductive layers 306 to be bent.

As disclosed herein, during fabrication of microelectronics package 300, adhesive layers, such as adhesive layers 112, may be used to attach dies 304 to thermally conductive layers 306. In addition, solder masks, such as solder masks 114, may be used to form through holes in thermally conductive layers 306 as disclosed herein.

As shown in FIG. 3B, ends 308 may be bent and connected directly to substrate 302, which may include thermally conductive components, such as a copper, a thermal interface material, or other metallic inlay that may be used to carry heat away from thermally conductive layers 306. While FIG. 3B shows ends 308 having different lengths and potentially overhanging one another, ends 308 may be trimmed such that ends 308 are flush with one another as indicated by line 312.

As shown in FIG. 3C, a heat pipe 310 may be connected to substrate 302. Ends 308 of thermally conductive layers 306 may be connected to the heat pipe 310, such as with a thermal interface material. Heat pipe 310 may be any cooling structure such as a thick copper trace, a heat spreader, etc. Ends 308 may also be embedded within heat pipe 310. For example, heat pipe 310 may have one or more grooves or slots in which ends 308 may be embedded with or without a thermal interface material. Heat pipe 310 may be a hollow component, such as a tube, in which a liquid may flow should heat pipe 310 be a component of a liquid cooled system. Ends 308 may also be located below heat pipe 310.

Figure 4A:
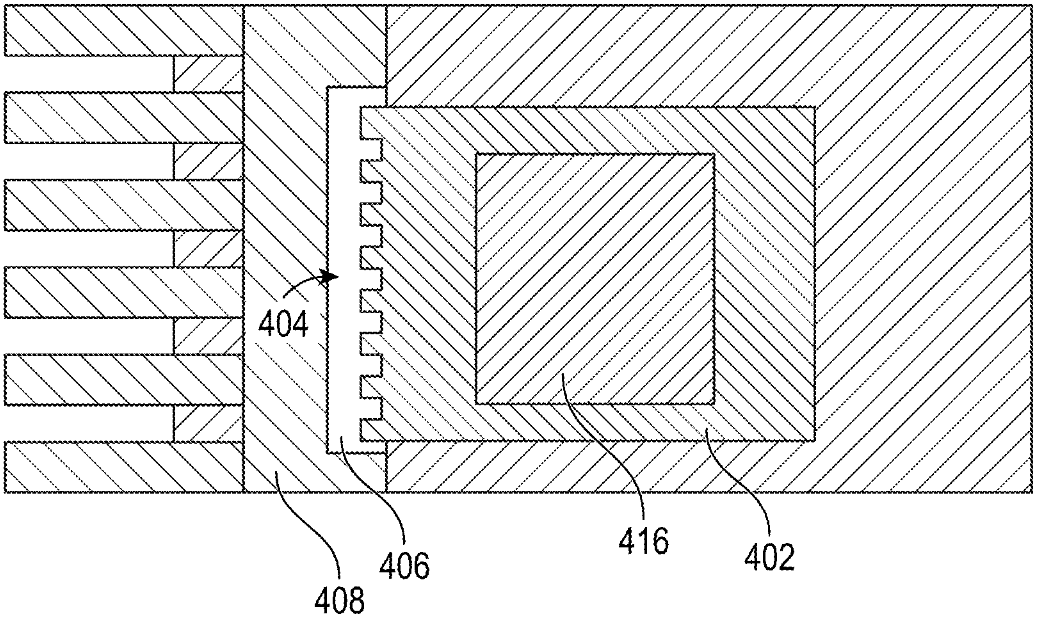
FIGS. 4A and 4B each shows coupling arrangements of a microelectronics package with a cooling solution in accordance with at least one example of this disclosure.
Figure 4B:
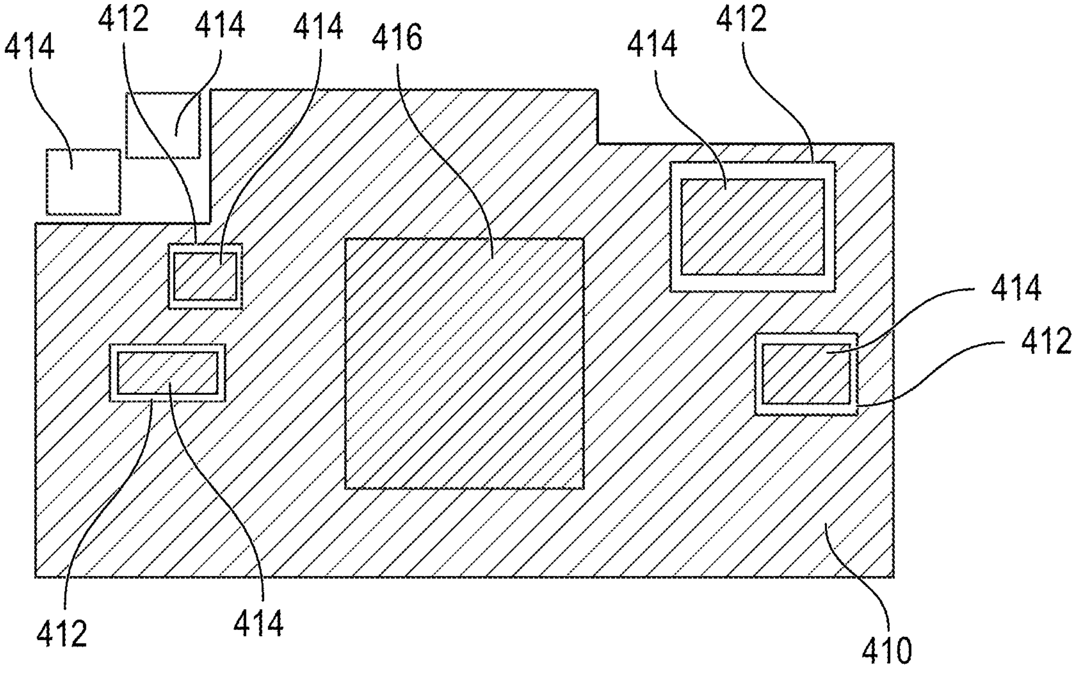

FIGS. 4A and 4B each shows coupling arrangements of a microelectronics package with a cooling solution in accordance with at least one example of this disclosure. As shown in FIG. 4A, a thermally conductive layer 402 may include notches 404 formed at one or more edges of thermally conductive layer 402. Notches 404 may provide increased surface area for contact with a thermal interface material 406 (e.g., a thermal grease). Notches 404 may also allow for thermally conductive layer 402 to allow for components external to a microelectronics package, such as other dies, die stacks, etc., to be located proximate the microelectronics package while still allowing thermally conductive layer 402 to be connected to a heat sink 408.

FIG. 4B shows a thermally conductive layer 410 that may include a plurality of cutouts 412. Cutouts 412 may allow devices 414, such as neighboring dies, to pass through thermally conductive layer 410. In both FIGS. 4A and 4B, a centrally located die 416 may operate and heat generated may be extracted via thermally conductive layers 402 and 410 with minimal heat transfer from dies 416 to surrounding components and/or devices 414.

Figure 5:
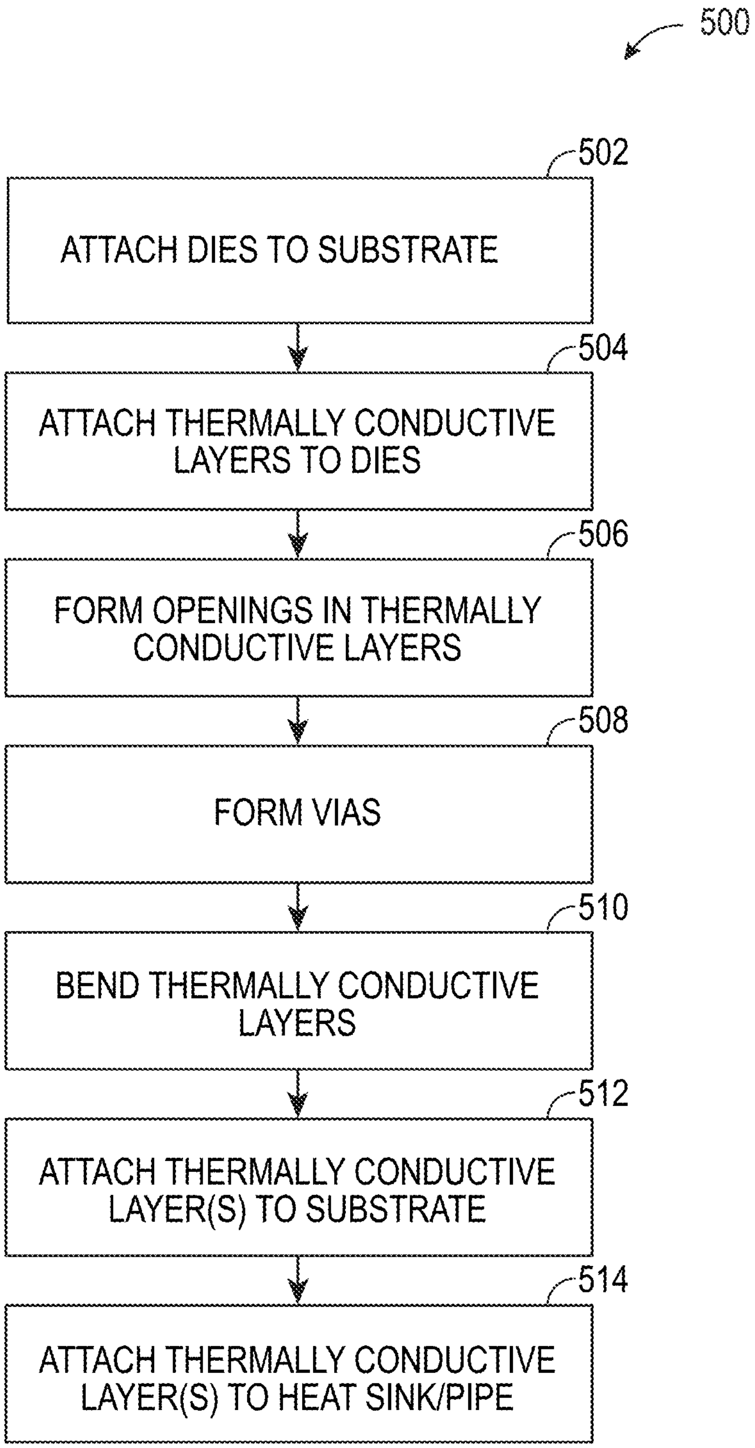
FIG. 5 show a method for manufacturing a microelectronics package in accordance with at least one example of this disclosure.
Figure 6A:
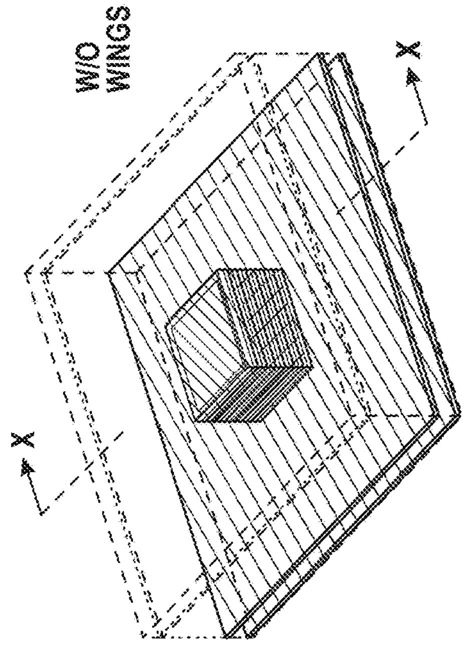
FIGS. 6A, 6B, 7A, and 7B show temperature maps in accordance with at least one example of this disclosure.
Figure 6B:
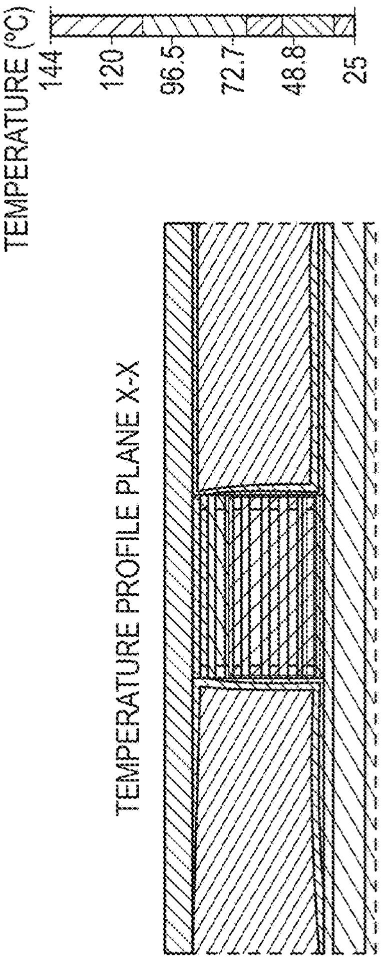
Figure 7A:
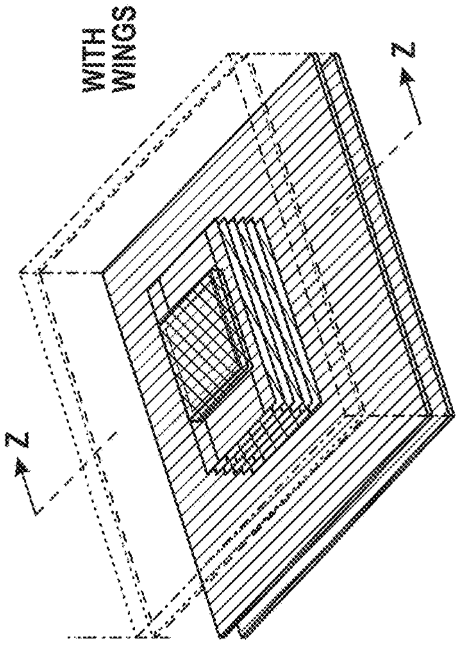
Figure 7B:
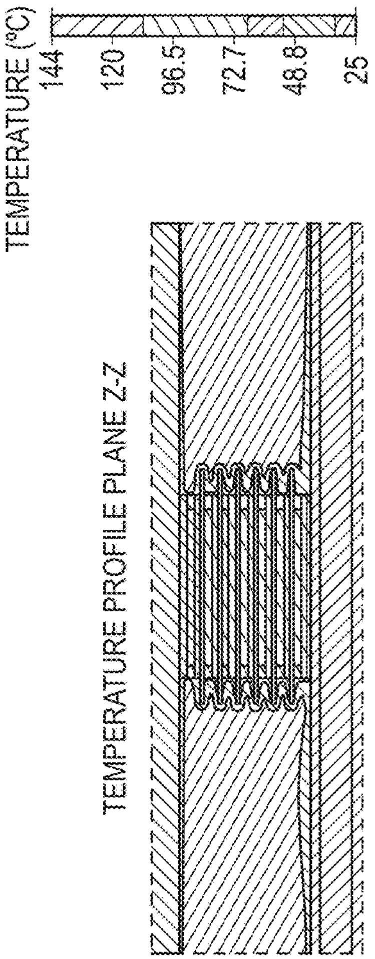

FIG. 5 show a method 500 for manufacturing a microelectronics package, such as microelectronics packages 100 and 300 in accordance with at least one example of this disclosure. Method 500 may begin at stage 502 where one or more dies may be attached to a substrate. Each of the dies may have a perimeter. As the dies are attached to the substrate, one or more thermally conductive layers may be attached to and/or in between respective dies (504). Attaching the dies to the substrate may also include attaching pre-stacked dies to the substrate. For example, a die stack may be fabricated having thermally conductive layers as disclosed herein and then the pre-formed die stack may be attached to the substrate.

As disclosed herein, the thermally conductive layers may define one or more openings that may be formed prior to or after attaching the thermally conductive layer to a die (506). For example, prior to attaching a thermally conductive layer to a die, one or more openings may be formed via etching, laser drilling, etc. The various openings in the thermally conductive layers may also be formed via laser drilling, etch, etc. after the thermally conductive layer is attached to a die. Once the various holes are formed, the holes may be filled with a material, such as copper, solder, etc., to form electrical interconnects between various dies. The material may form additional electrical interconnects in addition to interconnects already present on the dies or may be the only electrical interconnects between various dies. In a different process variant that may utilize a pre-stacked die stack, vias may be formed as part of the same process that forms the holes in the thermally conductive layer. Forming the various holes in thermally conductive layers after attaching the thermally conductive layers to dies ensures that the holes line up with respect to vias since the vias may be formed (508) as part of the same process that forms the holes in the thermally conductive layer.

Depending on the interconnect layout, recesses in the thermally conductive sheet may be individually designed for every interface layer. Methods for forming recesses include, but are not limited to, laser cut-out or stamping. The outer size and profile of the sheets may be customizable depending on the surrounding system and the cooling requirements for a specific chip-package-application. For example, as discussed with respect to FIGS. 4A and 4B, various cutouts and/or notches may be formed to accommodate surrounding systems.

If an electrically conductive sheet material is selected where the bumps or balls could wet and/or at least touch and generate a leakage path, this material used for the thermally conductive sheet may be coated with a non-electrically, but still thermally conductive, material. The isolation may be either achieved by an additional layer (e.g., polyimide) or an active oxidation of the material surface.

There are different types of adhesion layers, such as sticky tapes, thermal interface materials, solder layer, etc. Depending on the layer type, as well as on the thermally conductive sheet type, there are multiple options how to provide the adhesion layers used to bond dies and thermally conductive layers together. The thermally conductive sheet may be equipped with an adhesive layer. Thermal interface materials or sticky tape may be applied before the recesses are formed. Printing solder on metal sheet after recesses are formed may also be implemented. Mounting thermal interface material or sticky tape with recesses as in the thermally conductive sheet as separate layer(s) may also be implemented. Equipping the top and/or bottom device with an adhesion layer, e.g., printing solder and/or attaching material that will bond to the thermally conductive sheet upon mounting may be used as part of building the die stack and attaching thermally conductive layers to dies.

For rigid thermally conductive layers, sometimes referred to as wings, the adhesion layer may spare the regions where the wings extend beyond the devices. For bending wings, adhesion between the wings may improve the thermal dissipation and therefore the adhesion layer might cover the whole wing area, and need to cover at least the wing edges that attach to a printed circuit board (PCB).

As disclosed herein, the thermally conductive layers may be bent (510). Bending of the thermally conductive layers may occur after the thermally conductive layers are attached to dies and the die stack is formed. The thermally conductive layers may also be bent prior to being attached to a respective die and edges trimmed as needed.

Bending wings may require a process step for attaching edges of the wings to a PCB landing zone. A tacking process, such as mechanical punching and/or laser welding, may be suitable when an adhesive material is used that will stick upon mechanical pressure and/or heating.

Not every thermally conductive layer has to be bent. It is contemplated that one or more subsets of the thermally conductive layers may be bent, and one or more subsets of the thermally conductive layers may be unbent.

Each of the thermally conductive layers need not be made of the same material. For example, a first subset of the thermally conductive layers may be a metallic material and a second subset of thermally conductive layers may be non-metallic material. For instance, the first subset of thermally conductive layers may be copper, and the second subset of thermally conductive layers may be graphene. Non-metallic materials may be doped to improve thermally conductivity as well. For example, metallic and non-metallic materials may be doped with a thermally conductive material to form a composite material that may be used to form the thermally conductive layers.

One or more of the thermally conductive layers may be attached to the substrate (512). One or more of the thermally conductive layers may be attached to a heat sink and/or heat pipe (514). For example, a first subset of the thermally conductive layers may be connected directly to the substrate while second and third subsets of thermally conductive layers are connected to a heat sink and heat pipe, respectively. The heat pipe and/or heat sink may also be attached to the substrate.

The heat sink, sometimes referred to as a heat spreader, may be a frontside heat spreader that is used to provide enhanced cooling. The frontside heat spreader may be disposed on the die or package frontside before the interconnects are attached. Methods of disposal include, but are not limited to, lithography or (masked) sputtering for metals or lamination of a (structured) metal or graphite foil. If there is a UBM of the same material and thickness as the thermal spreader, it can be disposed along with the thermal spreader.

Placement and design of the thermally conductive layers may be determined and/or refined using simulations, such as finite element analysis, CFD technics, and/or other numerical methods. FIGS. 6A, 6B, 7A, and 7B show temperature maps in accordance with at least one example of this disclosure. The simulation results shown in FIGS. 6A, 6B, 7A, and 7B demonstrate the efficiency of thermally conductive layers disclosed herein. The simulation included a stack of seven packages with 2 Watts (W) power dissipation per package equipped with rigid thermal cooling wings. The stack is cooled by an air flow of 6 m/s, as can be found in fan cooled systems. The main heat flow is towards the top side, where a heat sink is mounted. The stack already has a thermal solution in place using TMVs for vertical heat transfer. Nevertheless, as shown in the results, the horizontal cooling wings drastically reduce the junction temperatures, which range from about 44° C. to about 139° C. in the TMV only case FIGS. 6A and 6B to a range of about 38° C. to about 95° C. with cooling wings. Table 1 also summarizes the data. The heat flux results in a cross-sectional plane perpendicular to the air flow direction. Comparing the case without wings to the case with wings it becomes clear that the cooling wings are efficient in dissipating heat to the ambient air.

TABLE 1

Die Maximum Junction Temperatures without Thermal Cooling Wings vs. With Wings

| | die 1 | die 2 | die 3 | die 4 | die 5 | die 6 | die 7 |
|---|---|---|---|---|---|---|---|
| w/o wings | 139 | 122 | 144 | 137 | 118 | 87 | 44 |
| with wings | 92 | 83 | 95 | 92 | 82 | 65 | 38 |

Figure 8:
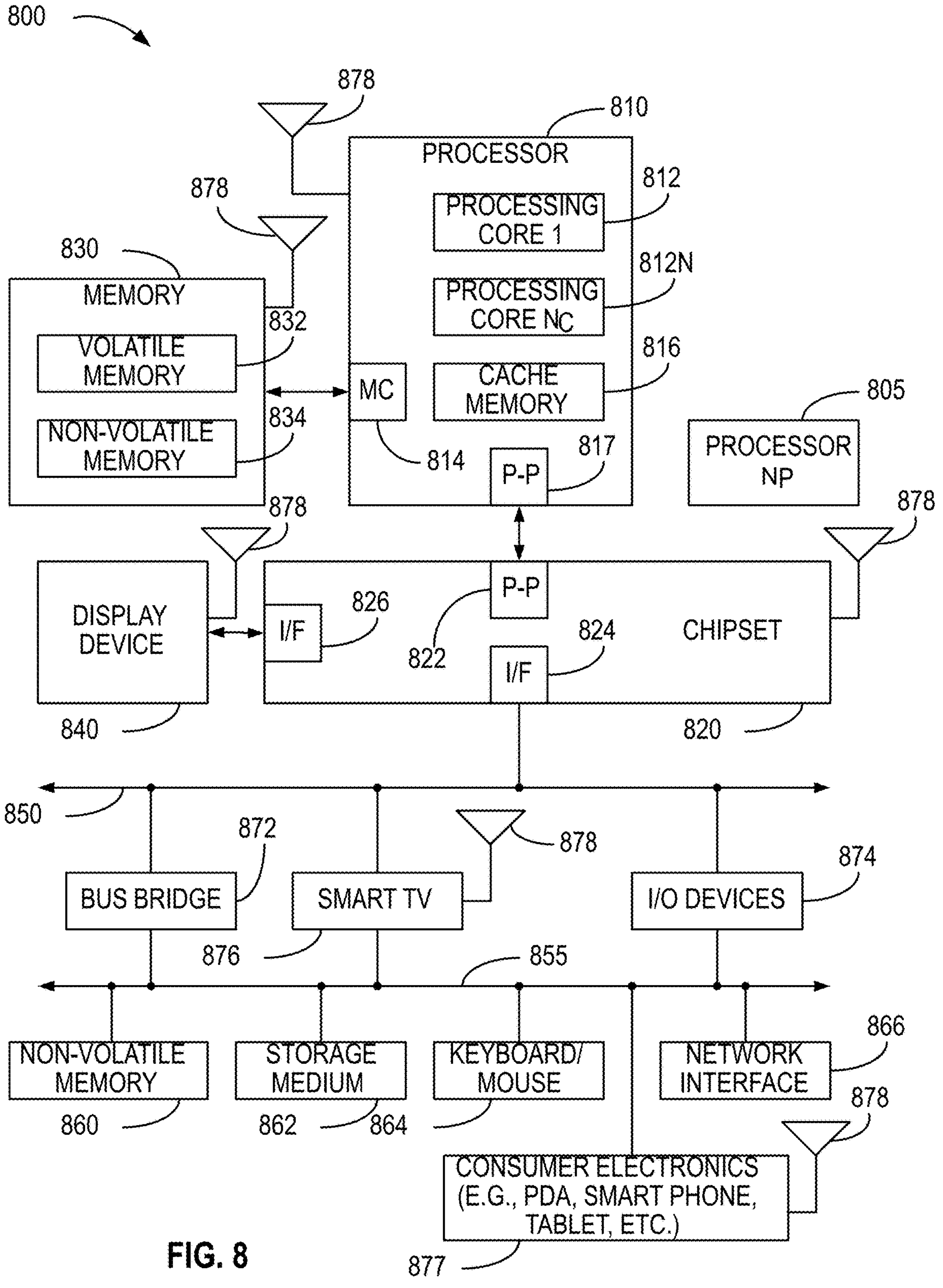
FIG. 8 shows system level diagram in accordance with at least one example of this disclosure.

FIG. 8 illustrates a system level diagram, according to one embodiment of the invention. For instance, FIG. 8 depicts an example of an electronic device (e.g., system) including microelectronics package 100 as described herein. FIG. 8 is included to show an example of a higher level device application for the present invention. In one embodiment, system 800 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 800 is a system on a chip (SOC) system.

In one embodiment, processor 810 has one or more processing cores 812 and 812N, where 812N represents the Nth processor core inside processor 810 where N is a positive integer. In one embodiment, system 800 includes multiple processors including processors 810 and 805, where processor 805 has logic similar or identical to the logic of processor 810. In some embodiments, processing core 812 includes, but is not limited to, pre-fetch logic to fetch instructions, decode logic to decode the instructions, execution logic to execute instructions and the like. In some embodiments, processor 810 has a cache memory 816 to cache instructions and/or data for system 800. Cache memory 816 may be organized into a hierarchal structure including one or more levels of cache memory.

In some embodiments, processor 810 includes a memory controller 814, which is operable to perform functions that enable the processor 810 to access and communicate with memory 830 that includes a volatile memory 832 and/or a non-volatile memory 834. In some embodiments, processor 810 is coupled with memory 830 and chipset 820. Processor 810 may also be coupled to a wireless antenna 878 to communicate with any device configured to transmit and/or receive wireless signals. In one embodiment, the wireless antenna interface 878 operates in accordance with, but is not limited to, the IEEE 802.11 standard and its related family, Home Plug AV (HPAV), Ultra Wide Band (UWB), Bluetooth, WiMax, or any form of wireless communication protocol.

In some embodiments, volatile memory 832 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 834 includes, but is not limited to, flash memory, phase change memory (PCM), read-only memory (ROM), electrically erasable programmable read-only memory (EEPROM), or any other type of non-volatile memory device.

Memory 830 stores information and instructions to be executed by processor 810. In one embodiment, memory 830 may also store temporary variables or other intermediate information while processor 810 is executing instructions. In the illustrated embodiment, chipset 820 connects with processor 810 via Point-to-Point (PtP or P-P) interfaces 817 and 822. Chipset 820 enables processor 810 to connect to other elements in system 800. In some embodiments of the invention, interfaces 817 and 822 operate in accordance with a PtP communication protocol such as the Intel® QuickPath Interconnect (QPI) or the like. In other embodiments, a different interconnect may be used.

In some embodiments, chipset 820 is operable to communicate with processor 810, 805, display device 840, and other devices 872, 876, 874, 860, 862, 864, 866, 877, etc. Chipset 820 may also be coupled to a wireless antenna 878 to communicate with any device configured to transmit and/or receive wireless signals.

Chipset 820 connects to display device 840 via interface 826. Display device 840 may be, for example, a liquid crystal display (LCD), a plasma display, cathode ray tube (CRT) display, or any other form of visual display device. In some embodiments of the invention, processor 810 and chipset 820 are merged into a single SOC. In addition, chipset 820 connects to one or more buses 850 and 855 that interconnect various elements 874, 860, 862, 864, and 866. Buses 850 and 855 may be interconnected together via a bus bridge 872. In one embodiment, chipset 820 couples with a non-volatile memory 860, a mass storage device(s) 862, a keyboard/mouse 864, and a network interface 866 via interface 824, smart TV 876, consumer electronics 877, etc.

In one embodiment, mass storage device 862 includes, but is not limited to, a solid state drive, a hard disk drive, a universal serial bus flash memory drive, or any other form of computer data storage medium. In one embodiment, network interface 866 is implemented by any type of well known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 8 are depicted as separate blocks within the system 800, the functions performed by some of these blocks may be integrated within a single semiconductor circuit or may be implemented using two or more separate integrated circuits. For example, although cache memory 816 is depicted as a separate block within processor 810, cache memory 816 (or selected aspects of 816) can be incorporated into processor core 812.

Additional Notes

The following, non-limiting examples, detail certain aspects of the present subject matter to solve the challenges and provide the benefits discussed herein, among others.

Example 1 is a microelectronics package comprising: a substrate; a first die connected to the substrate, the first die having a first perimeter; a second die having a second perimeter; and a thermally conductive layer located in between the first die and the second die, the thermally conductive layer extending past at least one of a portion of the first and second perimeters.

In Example 2, the subject matter of Example 1 optionally includes wherein the thermally conductive layer extends past opposite ends of at least one of the first and second perimeter.

In Example 3, the subject matter of any one or more of Examples 1-2 optionally include wherein the thermally conductive layer extends past the entire portion of the at least one of the first and second perimeter.

In Example 4, the subject matter of any one or more of Examples 1-3 optionally include wherein at least a portion of the thermally conductive layer is connected to the substrate.

In Example 5, the subject matter of any one or more of Examples 1~4 optionally include at least one via extending from the second die to the first die, wherein the thermally conductive layer defines at least one through hole sized to allow a respective electrical interconnect to pass through the thermally conductive layer.

In Example 6, the subject matter of any one or more of Examples 1-5 optionally include wherein a portion of the thermally conductive layer extending past the portion of the first and second perimeter is flexible.

In Example 7, the subject matter of any one or more of Examples 1-6 optionally include wherein the thermally conductive layer is a metallic material.

In Example 8, the subject matter of any one or more of Examples 1-7 optionally include wherein the thermally conductive layer is a graphene or carbon based material.

In Example 9, the subject matter of any one or more of Examples 1-8 optionally include a heat sink connected to the thermally conductive layer.

In Example 10, the subject matter of any one or more of Examples 1-9 optionally include a heat pipe or heat spreader connected to the thermally conductive layer.

Example 11 is a microelectronics package comprising: a substrate; a plurality of dies stacked upon one another, each of the plurality of dies having a perimeter; and a plurality of thermally conductive layers, each of the plurality of thermally conductive layers located in between two of the plurality of dies and extend past a portion of the perimeter of the two of the plurality of dies.

In Example 12, the subject matter of Example 11 optionally includes wherein at least one of the thermally conductive layers extends past opposite ends of at least one of the plurality of dies.

In Example 13, the subject matter of any one or more of Examples 11-12 optionally include wherein at least one of the thermally conductive layers extends past the entire portion of the at least one of the plurality of dies.

In Example 14, the subject matter of any one or more of Examples 11-13 optionally include wherein a portion of at least one of the thermally conductive layers is connected to the substrate.

In Example 15, the subject matter of any one or more of Examples 11-14 optionally include wherein a portion of each of the plurality of thermally conduct layers is connected to the substrate.

In Example 16, the subject matter of any one or more of Examples 11-15 optionally include a plurality of electrical interconnects extending through at least a portion of the plurality of dies, wherein each of the thermally conductive layers defines through holes sized to allow a respect vias to pass therethrough.

In Example 17, the subject matter of any one or more of Examples 11-16 optionally include wherein at least one of the plurality of thermally conductive layers is flexible.

In Example 18, the subject matter of any one or more of Examples 11-17 optionally include wherein at least one of the plurality of thermally conductive layers is a metallic material.

In Example 19, the subject matter of any one or more of Examples 11-18 optionally include wherein at least one of the plurality of thermally conductive layers is a graphene or carbon based material.

In Example 20, the subject matter of any one or more of Examples 11-19 optionally include a heat sink connected to at least one of the plurality of thermally conductive layers.

In Example 21, the subject matter of any one or more of Examples 11-20 optionally include a heat pipe or heat spreader connected to at least one of the plurality of thermally conductive layers.

Example 22 is a method of manufacturing a microelectronics package, the method comprising: attaching a first die to a substrate, the first die having a first perimeter; attaching a thermally conductive layer to the first die, the thermally conductive layer defining an opening located within the first perimeter when attached to the first die; attaching a second die to the thermally conductive layer, the second die having a second perimeter; and forming at plurality of vias passing from the first die to the second die and passing through the opening of the thermally conductive layer, wherein the thermally conductive layer at least partially extends past at least one of the first and second perimeters.

In Example 23, the subject matter of Example 22 optionally includes bending the thermally conductive layer.

In Example 24, the subject matter of any one or more of Examples 22-23 optionally include attaching a portion of the thermally conductive layer to the substrate.

In Example 25, the subject matter of any one or more of Examples 22-24 optionally include attaching a heat pipe to the substrate; and attaching a portion of the thermally conductive material to the heat pipe.

In Example 26, the subject matter of any one or more of Examples 22-25 optionally include attaching a heat sink to an edge of the thermally conductive layer.

In Example 27, the microelectronics packages, systems, apparatuses, or method of any one or any combination of Examples 1-26 can optionally be configured such that all elements or options recited are available to use or select from.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A microelectronics package comprising:

a substrate;

a first die connected to the substrate, the first die having a first perimeter;

a second die having a second perimeter;

a plurality of electrical interconnects extending between the first die and the second die; and a sheet located between the first die and the second die, the sheet including a thermally conductive material, the sheet defining a plurality of through holes, respective ones of the plurality of through holes sized to allow one or more of the plurality of electrical interconnects to pass through the sheet, the sheet extending past at least one of a first portion of the first perimeter and a second portion of the second perimeter.

2. The microelectronics package of claim 1, wherein the sheet extends past opposite ends of at least one of the first perimeter and the second perimeter.

3. The microelectronics package of claim 1, wherein the sheet extends past an entire portion of at least one of the first perimeter and the second perimeter.

4. The microelectronics package of claim 1, wherein at least a portion of the sheet is connected to the substrate.

5. The microelectronics package of claim 1, further comprising at least one via extending from the second die to the first die.

6. The microelectronics package of claim 1, wherein a portion of the sheet extending past the first portion of the first perimeter and the second portion of the second perimeter is flexible.

7. The microelectronics package of claim 1, wherein the sheet includes a metallic material.

8. The microelectronics package of claim 1, wherein the sheet includes a graphene or carbon based material.

9. The microelectronics package of claim 1, further comprising a heat sink connected to the sheet.

10. The microelectronics package of claim 1, further comprising a heat pipe or heat spreader connected to the sheet.

11. A microelectronics package comprising:

a substrate;

a plurality of dies stacked upon one another to form a die stack, the die stack attached to the substrate, each of the plurality of dies having a perimeter; and a plurality of layers including a thermally conductive material, the plurality of layers respectively located between adjacent dies of the plurality of dies and respectively extending past at least a portion of the perimeter of the adjacent dies of the plurality of dies, wherein a portion of at least one of the plurality of layers between adjacent dies is connected to the substrate.

12. The microelectronics package of claim 11, wherein at least one layer of the plurality of layers extends past opposite ends of at least one die of the plurality of dies.

13. The microelectronics package of claim 11, wherein a portion of at least one layer of the plurality of layers is connected to the substrate.

14. The microelectronics package of claim 11, wherein a portion of each of the plurality of layers is connected to the substrate.

15. The microelectronics package of claim 11, further comprising a plurality of electrical interconnects extending through at least a portion of the plurality of dies, wherein the plurality of layers defines through holes sized to allow respective vias to pass therethrough.

16. The microelectronics package of claim 11, wherein at least one layer of the plurality of layers is flexible.

17. The microelectronics package of claim 11, wherein at least one layer of the plurality of layers includes a metallic material.

18. The microelectronics package of claim 11, wherein at least one layer of the plurality of layers includes a graphene or carbon based material.

19. The microelectronics package of claim 11, further comprising a heat sink connected to at least one layer of the plurality of layers.

20. The microelectronics package of claim 11, further comprising a heat pipe or heat spreader connected to at least one layer of the plurality of layers.

* * * * *